(12) United States Patent
Cical et al.

(10) Patent No.: US 10,243,526 B1
(45) Date of Patent: Mar. 26, 2019

(54) SELF-BIASED OPERATIONAL TRANSCONDUCTANCE AMPLIFIER-BASED REFERENCE CIRCUIT

(71) Applicant: Xilinx, Inc., San Jose, CA (US)

(72) Inventors: Ionut C. Cical, Saggart (IE); John K. Jennings, Gleanageary (IE); Diarmuid Collins, Dunshaughlin (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/895,829

(22) Filed: Feb. 13, 2018

(51) Int. Cl.
 *H03F 3/45* (2006.01)
 *H03F 1/30* (2006.01)
 *H03F 3/195* (2006.01)
 *G05F 3/26* (2006.01)

(52) U.S. Cl.
 CPC ......... *H03F 3/45273* (2013.01); *G05F 3/262* (2013.01); *H03F 1/301* (2013.01); *H03F 3/195* (2013.01); *H03F 3/45475* (2013.01); *H03F 2203/21148* (2013.01); *H03F 2203/45031* (2013.01); *H03F 2203/45112* (2013.01); *H03F 2203/45146* (2013.01); *H03F 2203/45202* (2013.01); *H03F 2203/45288* (2013.01)

(58) Field of Classification Search
 None
 See application file for complete search history.

(56) References Cited

PUBLICATIONS

Singh, Simran et al., "An Ultra Low-Voltage CMOS Self-Biased OTA," International Journal of Computer Networks and Wireless Communications (IJCNWC), May-Jun. 2016, pp. 23-27, vol. 6, No. 3.

*Primary Examiner* — Patricia T Nguyen
(74) *Attorney, Agent, or Firm* — Kin-Wah Tong

(57) ABSTRACT

A device may include a voltage-to-current converter circuit having an operational transconductance amplifier (OTA), the voltage-to-current converter circuit for generating a bias current that is proportional to a reference voltage at a reference voltage input port of the OTA, and a bias current feedback path for providing the bias current to a bias current input port of the OTA. The device may further include a startup current generator circuit coupled to the bias current input port of the OTA, the startup current generator circuit controllable to provide a startup current to the bias current input port during a startup of the device and to be deactivated after the startup of the device.

20 Claims, 5 Drawing Sheets

400

SELF-BIASED OPERATIONAL TRANSCONDUCTANCE AMPLIFIER-BASED REFERENCE CIRCUIT

TECHNICAL FIELD

The present disclosure relates generally to reference circuits containing operational transconductance amplifiers.

BACKGROUND

Bias currents and voltages may be generated from a reference voltage using a voltage-to-current converter (V2I). The core architecture of a V2I may comprise a negative feedback loop to set up a defined current across a resistor using an operational transconductance amplifier (OTA). The OTA, however, uses its own bias which is traditionally generated using a constant transconductance (constant-$g_m$), bias circuit. This type of arrangement also uses a complex separate startup circuit.

SUMMARY

In one example, the present disclosure provides a first device that includes a self-biased operational transconductance amplifier (OTA). For example, the device can include a voltage-to-current converter circuit having an operational transconductance amplifier (OTA), the voltage-to-current converter circuit for generating a bias current that is proportional to a reference voltage at a reference voltage input port of the OTA, and a bias current feedback path for providing the bias current to a bias current input port of the OTA. The device may further include a startup current generator circuit coupled to the bias current input port of the OTA. In one example, the startup current generator circuit is controllable to provide a startup current to the bias current input port during a startup of the device and to be deactivated after the startup of the device.

In an example device, the voltage-to-current converter circuit may further include a first p-channel metal-oxide-semiconductor field effect transistor (PMOS) and a resistor. In one example, the OTA may include a reference voltage input port, a feedback voltage input port, and an output voltage port. In such an example, the device may further include a gate of the first PMOS coupled to the output voltage port of the OTA, a source of the first PMOS coupled to a positive power supply of the device, a first end of the resistor coupled to a ground of the device, and a second end of the resistor coupled to a drain of the first PMOS and to the feedback voltage input port of the OTA in a feedback net. In addition, the startup current generator circuit may be controlled by a voltage of the feedback net.

In one example, the bias current feedback path may include a second PMOS having a gate coupled to the output voltage port of the OTA, a source coupled to the positive power supply of the device, and a drain coupled to the bias current input port of the OTA. In addition, the first PMOS and the second PMOS may form a current mirror. In one example, the bias current is provided via a drain of the second PMOS. In one example, the bias current is proportional to a current through the first PMOS. In one example, a voltage of the feedback net is based upon the current through the first PMOS and a resistance of the resistor.

In another example, the present disclosure provides a second device that includes a self-biased operational transconductance amplifier (OTA). For instance, the device may include an operational transconductance amplifier (OTA) having a reference voltage input port, a feedback voltage input port, a bias current input port, and an output voltage port. The device may further include, a first p-channel metal-oxide-semiconductor field effect transistor (PMOS) having a gate coupled to the output voltage port of the OTA and a source coupled to a positive power supply, and a resistor having a first end is coupled to a ground, and second end coupled to a drain of the first PMOS and to the feedback voltage input port of the OTA in a feedback net. In one example, the device may also include a second PMOS having a gate coupled to the output voltage port of the OTA, a source coupled to a positive power supply, and a drain coupled to the bias current input port of the OTA. The device may further include a startup current generator circuit coupled to the bias current input port of the OTA. In one example, the startup current generator circuit is to provide a current to the bias current input port when a voltage at the feedback net is below a threshold voltage, and to provide no current to the bias current input port when the voltage at the feedback net is above the threshold voltage.

In one or more of these devices, the startup current generator circuit may include a switch in series with a resistor. In another example, the startup current generator circuit may include a load switch. In another example, the startup current generator circuit may include a switch in series with a transistor diode. In still another example, the startup current generator circuit may include a PMOS in series with a resistor. In addition, in one example, the startup current generator circuit may be coupled to a positive power supply of the device.

In another example, the present disclosure provides a method for providing a startup current. For example, the method can include providing a startup current to a bias current input port of an operational transconductance amplifier (OTA) of a voltage-to-current converter circuit of a device. The startup current may be provided via a startup current generator circuit during a startup of the device. The method may also include generating a bias current via the voltage-to-current converter circuit, the bias current proportional to a reference voltage at a reference voltage input port of the OTA, and providing the bias current to the bias current input port of the OTA. The method may further include deactivating the startup current generator circuit to cease providing the startup current to the bias current input port of the OTA when an operational state of the voltage-to-current converter circuit is detected.

It should be noted that although the terms, "first," "second," etc., have been used above, the use of these terms are intended as labels only. Thus, the use of a term such as "third" in one example does not necessarily imply that the example must in every case include a "first" and/or a "second" of a similar element. In other words, the use of the terms "first," "second," "third," and "fourth," do not imply a particular number of those elements corresponding to those numerical values.

BRIEF DESCRIPTION OF THE DRAWINGS

Accompanying drawings show example devices and methods in accordance with one or more aspects of the disclosure; however, the accompanying drawings should not be taken to limit the disclosure to the examples shown, but are for explanation and understanding only.

To facilitate understanding, identical reference numerals have been used, where possible, to designate identical elements that are common to the figures.

DETAILED DESCRIPTION

Bias currents and voltages may be generated from a reference voltage using a voltage-to-current converter (V2I). The core architecture of a voltage-to-current converter may comprise a negative feedback loop to set up a defined current across a resistor using an operational transconductance amplifier (OTA). However, the OTA may use its own bias current input which may be generated using a constant transconductance (constant-$g_m$) bias circuit. This type of arrangement may also use a complex startup circuit which results in a larger device area and power consumption. This type of voltage-to-current converter also produces a current that is a function of both transistor and resistor variation. The resulting bias current can vary by as much as plus or minus 50 percent across process, voltage, and temperature (PVT).

Examples of the present disclosure provide voltage-to-current converter devices, or circuits, which utilize self-biased OTAs and startup current generator circuits as described herein. Notably, the need for a constant-$g_m$ startup circuit is eliminated. In addition, startup current generator circuits are provided that utilize significantly less components as compared to startup circuits in alternative voltage-to-current converter implementations. In one example, a startup current generator circuit provides the OTA bias before the voltage-to-current converter starts-up. In various examples, the startup current generator circuit comprises a load switch, a switch in series with a resistor, a switch in series with a transistor diode, or a PMOS in series with a resistor. In one example, as the voltage-to-current converter starts up, an output, and specifically a feedback net coupled to a feedback voltage input port of the OTA, starts to rise. Once the voltage of the feedback net rises above a threshold voltage, the startup current generator circuit switches out. At this point, an output current from the voltage-to-current converter fed back into the OTA self-biases the OTA.

Examples of the present disclosure provide a large savings in area and power consumption due to the elimination of a constant-$g_m$ bias circuit and associated startup circuit. In addition, examples of the present disclosure provide output bias currents with a reduction in PVT variation of up to three times or more. Specifically, the bias current is generated across a resistor making the variation purely a function of resistor spread (e.g., plus or minus 15 percent across PVT). This provides a 3.3 times reduction over the plus or minus 50 percent bias current variation seen in alterative implementations. These and other aspects of the present disclosure are discussed in greater detail below in connection with the examples of FIGS. 1-5.

Figure 1:
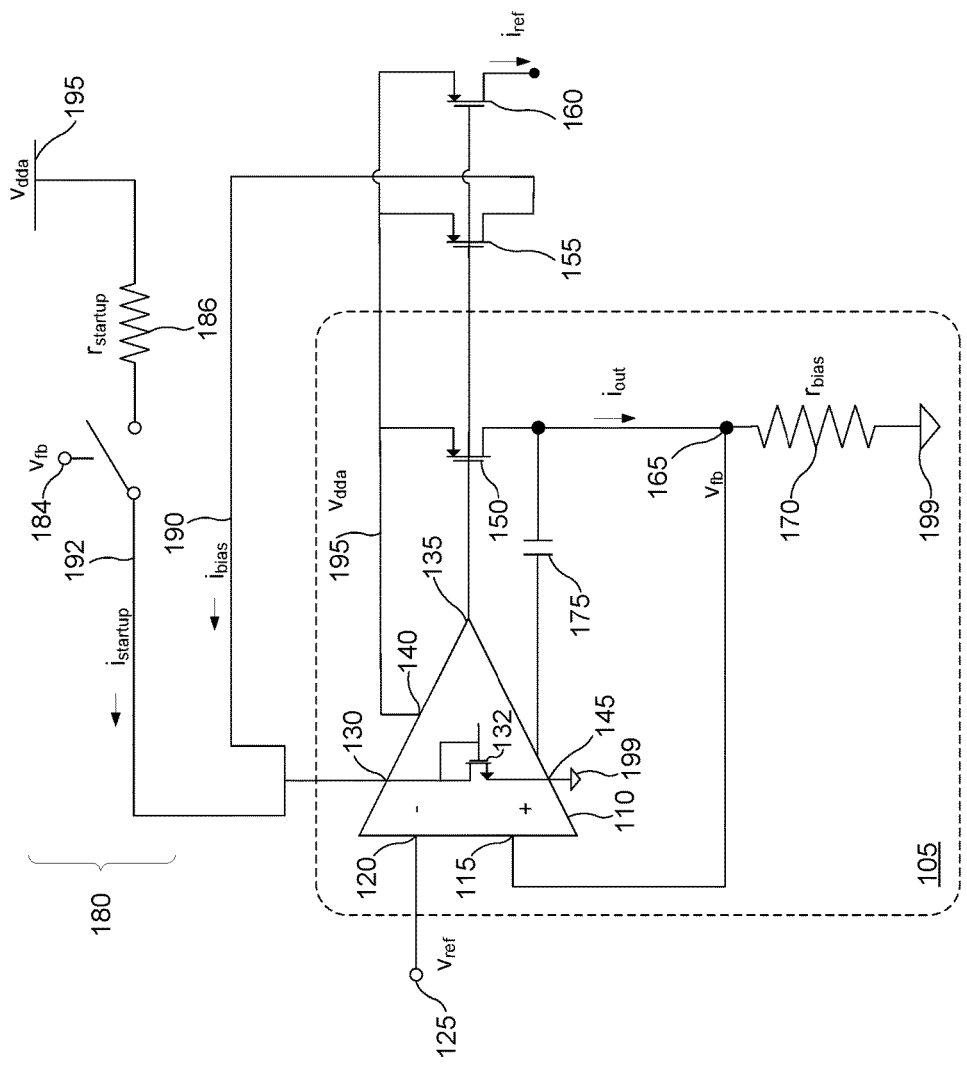
FIG. 1 illustrates a block diagram of a first example circuit or device.

To aid in understanding the present disclosure, an example device 100 of the present disclosure is depicted in FIG. 1. In particular, device 100 may comprise a circuit, or a portion of an integrated circuit that is designed to provide one or more bias currents (also referred to as reference currents) that is/are proportional to a reference voltage at a reference voltage input port of an OTA. In other words, device 100 may comprise part of a larger circuit in a system-on-chip (SOC) design. As illustrated in FIG. 1, device 100 includes a voltage-to-current converter circuit 105 and a startup current generator circuit 180. In one example, the voltage-to-current converter circuit 105 may receive an input reference voltage $v_{ref}$ at input port 125. The input port 125 may be coupled to a reference voltage input port 120 of an operational transconductance amplifier (OTA) 110. In the example of FIG. 1, an output voltage of the OTA 110 at output voltage port 135 is related to a difference between a voltage at a feedback voltage input port 115 (e.g., $v_{fb}$) and a voltage at the reference voltage input port 120 (e.g., $v_{ref}$).

In the present example, the voltage at output voltage port $v_{out}$ may be given by Equation 1, where (z) is a factor proportional to the transconductance ($g_{m\text{-}ota}$) of OTA 110:

$$v_{out}=(v_{fb}-v_{ref})*z \qquad \text{Equation 1:}$$

It should be noted that a differential OTA, such as OTA 110, may generate a current $i_{ota}$ that is given by Equation 2:

$$i_{ota}=(v_{fb}-v_{ref})*g_{m\text{-}ota} \qquad \text{Equation 2:}$$

In addition, an OTA functioning as a differential voltage amplifier may drop the current $i_{ota}$ across an internal resistor to ground to provide an output voltage per Equation 3, where (r) is the output resistance of the amplifier:

$$v_{out}=(v_{fb}-v_{ref})*g_{m\text{-}ota}*r \qquad \text{Equation 3:}$$

Thus, in one example, (z) may be equal the transconductance of OTA 110 ($g_{m\text{-}ota}$) times the output resistance (r).

As illustrated in FIG. 1, the output voltage port 135 of OTA 110 is coupled to a gate of a first p-channel metal-oxide-semiconductor field effect transistor (PMOS) 150. The source of first PMOS 150 is coupled to a positive power supply 195 having a voltage $v_{dda}$. When there is zero volts on the gate of first PMOS 150, the source-to-gate voltage ($v_{sg}$) of PMOS is $v_{dda}$. In the present example, the resistance $r_{bias}$ of resistor 170 may be selected such that the source-to-drain voltage ($v_{sd}$) provides for operation of PMOS 150 in the linear region. As such, a current $i_{out}$ may flow from the source to the drain of first PMOS 150 that is based upon the parameters of first PMOS 150 operating in the linear region. As further illustrated in FIG. 1, the output current $i_{out}$ drops across resistor 170 to ground 199 to provide a feedback voltage $v_{fb}$ at feedback net 165 in accordance with Equation 4 (Ohm's Law):

$$v_{fb}=i_{out}*r_{bias} \qquad \text{Equation 4:}$$

In the present example, feedback net 165 is coupled to the drain of first PMOS 150, a first end of resistor 170 (where the second end of the resistor 170 is coupled to ground 199), and the feedback voltage input port 115. The OTA 110 and feedback net 165 are arranged to force $v_{fb}$ to be equal to $v_{ref}$. For example, if $v_{ref}$ is set to 2 volts and $v_{fb}$ rises to 2.2 volts, $v_{out}$ will rise per Equation 1 above. In addition, since the gate voltage of PMOS 150 rises (with PMOS is operating in the linear region), the output current $i_{out}$ consequently falls. As $i_{out}$ falls, $v_{fb}$ is also reduced per Equation 4 above, consequently reducing the difference between $v_{fb}$ and $v_{ref}$. Similarly, if $v_{fb}$ falls to 1.8 volts, $v_{out}$ will fall per Equation 1 above, causing $i_{out}$, and consequently $v_{fb}$, to both rise. It therefore follows that the output current $i_{out}$ is a function of the input reference voltage $v_{ref}$ and the resistance $r_{bias}$ of resistor 170 per Equation 5:

$$i_{out}=v_{ref}/r_{bias} \qquad \text{Equation 5:}$$

OTA 110 may further include a positive power supply port 140 coupled to positive power supply 195, a negative power supply port 145 coupled to ground 199, and a bias current input port 130. In one example, voltage-to-current converter circuit 105 also includes a stabilization capacitor 175 between feedback net 165 (e.g., from the drain of first PMOS 150) and OTA 110. In one example, stabilization capacitor 175 is coupled to the output port 135 (however, the coupling may include other internal components of OTA 110 (not shown)). In addition, since OTAs having various internal designs may be used in accordance with the present disclosure, the specific internal architecture of OTA 110 is omitted from FIG. 1. As just one example, the OTA architecture may be based upon an n-channel metal-oxide-semiconductor field effect transistor (NMOS) 132.

In the present example, the transconductance of the OTA 110 is controlled via the bias current input port 130. In other implementations, a constant-$g_m$ circuit is used to provide an OTA bias current. The resulting bias current variation is a function of transistor and resistor variation within the constant-$g_m$ circuit. This type of circuit may involve large area and power requirements, and can result in bias current variation as much as plus or minus 50 percent. In contrast, the present device 100 uses an output of the voltage-to-current converter circuit 105 to self-bias the OTA 110. For example, as illustrated in FIG. 1, a second PMOS 155 is provided having a gate coupled to the output voltage port 135 (and to the gate of first PMOS 150). The source of second PMOS 155 is coupled to positive power supply 195 ($v_{dda}$). The drain of second PMOS 155 is coupled to the bias current input port 130 of OTA 110. The first PMOS 150 and second PMOS 155 form a current mirror. Accordingly, the current $i_{bias}$ via feedback path 190 is proportional to $i_{out}$. In one example, PMOS 150 and PMOS 155 may be sized relative to one another to provide a particular ratio between $i_{bias}$ and $i_{out}$. For instance, a particular transconductance value for OTA 110 may be desired. The resistance of resistor 170 and the sizing of PMOS 150 and PMOS 155 may be selected to provide the desired transconductance $g_{m\text{-}ota}$, e.g., in view of the supply voltage $v_{dda}$ and other parameters.

The current mirror may be extended to provide additional currents that are proportional to $i_{out}$. For example, a third PMOS 160 is provided having a gate coupled to the output voltage port 135 (and to the gates of first PMOS 150 and second PMOS 155). The source of third PMOS 160 is similarly coupled to positive power supply 195 ($V_{dda}$). The drain of third PMOS 160 may drive another portion of device 100 with a current $i_{ref}$ that is proportional to $i_{out}$. For instance, as mentioned above, device 100 may comprise a reference circuit that is part of a larger circuit in a system-on-chip (SOC) design, which may have other components that utilize a stable reference current, or stable reference currents. The current mirror may be further extended to provide additional paths with reference currents using similarly ganged PMOSs.

Device 100 further includes startup current generator circuit 180 to provide a startup current $i_{startup}$ to establish the transconductance $g_{m\text{-}ota}$ of OTA 110 at a startup of the device 110, and to be switched out when the self-biasing current $i_{bias}$ is at a sufficient level. For instance, the startup current generator circuit 180 may be switched out when $v_{fb}$ crosses a threshold (where the threshold corresponds to the desired self-biasing current $i_{bias}$).

In the example of FIG. 1, startup current generator circuit 180 comprises a switch 184 in series with a resistor 186 coupled to positive power supply 195 having voltage $V_{dda}$. The switch 184 may be configured with a threshold voltage and may be controlled by $v_{fb}$ from feedback net 165. The startup current generator circuit 180 may provide startup current $i_{startup}$ to bias current input port 130 of OTA 110 via path 192 when the switch 184 is closed (e.g., when $v_{fb}$ is below the threshold voltage of the switch 184). As such, the transconductance of OTA 110 ($g_{m\text{-}ota}$) may initially be based upon the startup current $i_{startup}$ at a startup of device 100. As $v_{fb}$ ramps up towards $v_{ref}$, the transconductance of OTA 110 ($g_{m\text{-}ota}$) may be based upon the startup current $i_{startup}$ plus the bias current $i_{bias}$. When $v_{fb}$ reaches the threshold voltage, switch 184 may turn off (open) and cut off the startup current $i_{startup}$ to bias current input port 130 of OTA 110 via path 192. At this time, the OTA 110 may be solely self-biased with bias current $i_{bias}$ from feedback path 190.

In one example, the threshold voltage may be set to switch out the startup current generator circuit 180 when the bias current $i_{bias}$ reaches an operational level for which the device 100 is designed. In another example, the threshold voltage may be set to switch out the startup current generator circuit 180 when the bias current $i_{bias}$ is not at a full operational level for which the device 100 is designed, but for a level when the bias current $i_{bias}$ is sufficient so that a metastable state of the device 100 is prevented, e.g., where the OTA 110 and feedback net 165 may self-stabilize and drive $v_{fb}$ to be equal to $v_{ref}$. It should also be noted that resistance $r_{startup}$ of resistor 186 may be selected to limit the startup current $i_{startup}$ to a safe operating level. In one example, $r_{startup}$ of resistor 186 may provide for $i_{startup}$ to be less than or equal to the desired value of $i_{bias}$ during full normal operation of device 100 (e.g., after a startup phase, at which time OTA 110 is fully self-biased). For instance, $i_{startup}$ may be provided with half a target value of $i_{bias}$, 75 percent of a target value for $i_{bias}$, etc.

Figure 2:
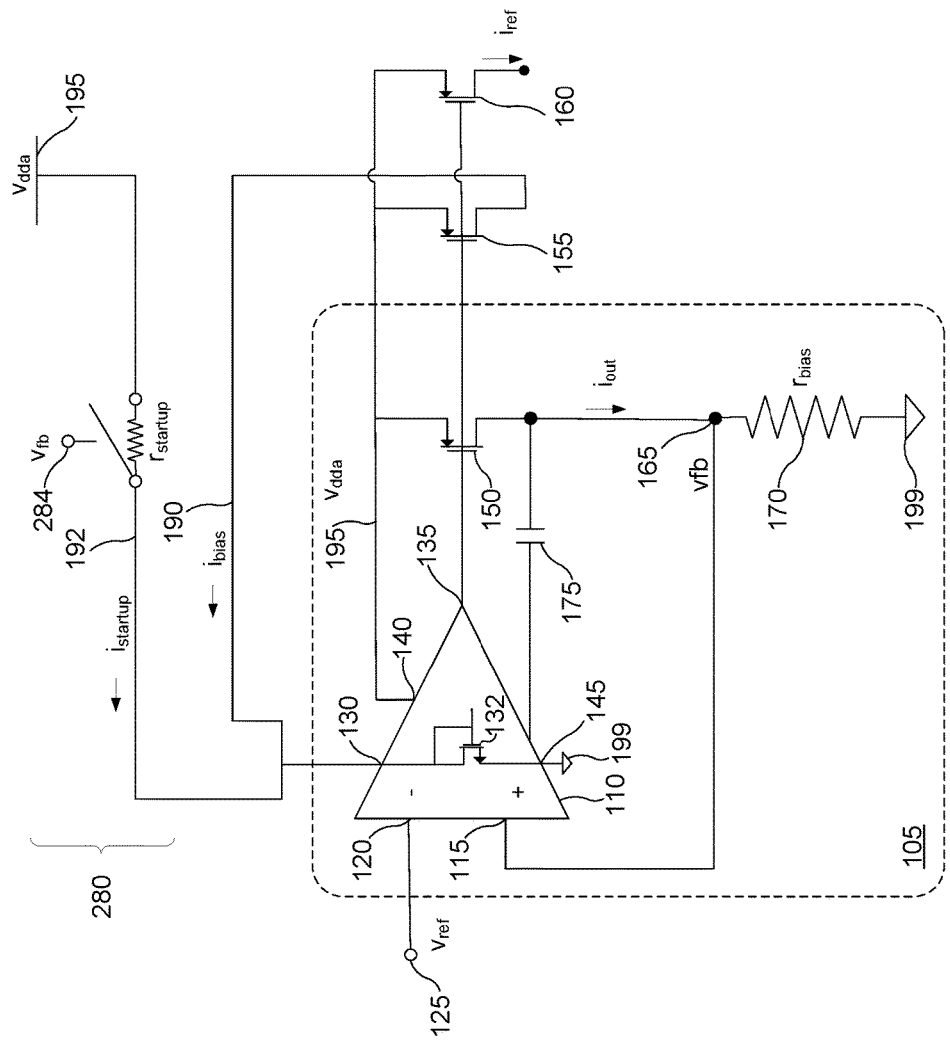
FIG. 2 illustrates a block diagram of a second example circuit or device.

To further aid in understanding the present disclosure, an example device 200 of the present disclosure is depicted in FIG. 2. In particular, device 200 may comprise a circuit, or a portion of an integrated circuit that is designed to provide a bias current that is proportional to a reference voltage at a reference voltage input port of an OTA. In other words, device 200 may comprise part of a larger circuit in a system-on-chip (SOC) design. At least a portion of device 200 contains the same or similar components as the example device 100 of FIG. 1. For instance, voltage-to-current converter circuit 105 (and all components thereof), second PMOS 155, feedback path 190, and third PMOS 160 may be the same or substantially similar components as those which are illustrated in FIG. 1 and described above. In addition, such components may have the same or substantially similar operations as described above in connection with the example of FIG. 1.

Device 200 further includes a startup current generator circuit 280. In the example of FIG. 2, startup current generator circuit 280 comprises a load switch 284 coupled to positive power supply 195 having voltage $V_{dda}$. The load switch 284 may be configured with a threshold voltage and may be controlled by $v_{fb}$ from feedback net 165. The startup current generator circuit 280 may provide startup current $i_{startup}$ to bias current input port 130 of OTA 110 via path 192 when the load switch 284 is closed (e.g., when $v_{fb}$ is below the threshold voltage of the load switch 284). As such, the transconductance of OTA 110 ($g_{m\text{-}ota}$) may initially be based upon the startup current $i_{startup}$ at a startup of device 200. As $v_{fb}$ ramps up toward $v_{ref}$, the transconductance of OTA 110 ($g_{m\text{-}ota}$) may be based upon the startup current $i_{startup}$ plus the bias current $i_{bias}$. When $v_{fb}$ reaches the threshold voltage, load switch 284 may turn off (open) and cut off the startup current $i_{startup}$ to bias current input port 130 of OTA 110 via path 192. At this time, the OTA 110 may be solely self-biased with bias current $i_{bias}$ from feedback path 190. In one example, the threshold voltage may be set to switch out the startup current generator circuit 280 when the bias current $i_{bias}$ reaches an operational level for which the device 200 is designed. In another example, the threshold voltage may be set to switch out the startup current generator circuit 280 when the bias current $i_{bias}$ is not at a full operational level for which the device 200 is designed, but for a level when the bias current $i_{bias}$ is sufficient so that a metastable state of the device 200 is prevented.

It should also be noted that a closed-state resistance $r_{startup}$ of load switch 284 may be selected to limit the startup current $i_{startup}$ to a safe operating level. In one example, $r_{startup}$ of load switch 284 may provide for $i_{startup}$ to be less than or equal to the desired value of $i_{bias}$ during full normal operation of device 200 (e.g., after a startup phase, at which point OTA 110 is fully self-biased), e.g., half a target value of $i_{bias}$, 75 percent of a target value for $i_{bias}$, etc. The closed-state resistance of $r_{startup}$ of load switch 284 may be provided via specifically designed or naturally arising factors of a layout and/or a fabrication process. For instance, bond wire resistance, lead frame resistance, silicon process resistance, and so forth may be naturally arising factors and/or may be specifically engineered by enhancing and/or reducing certain physical features of load switch 284 during fabrication.

Figure 3:
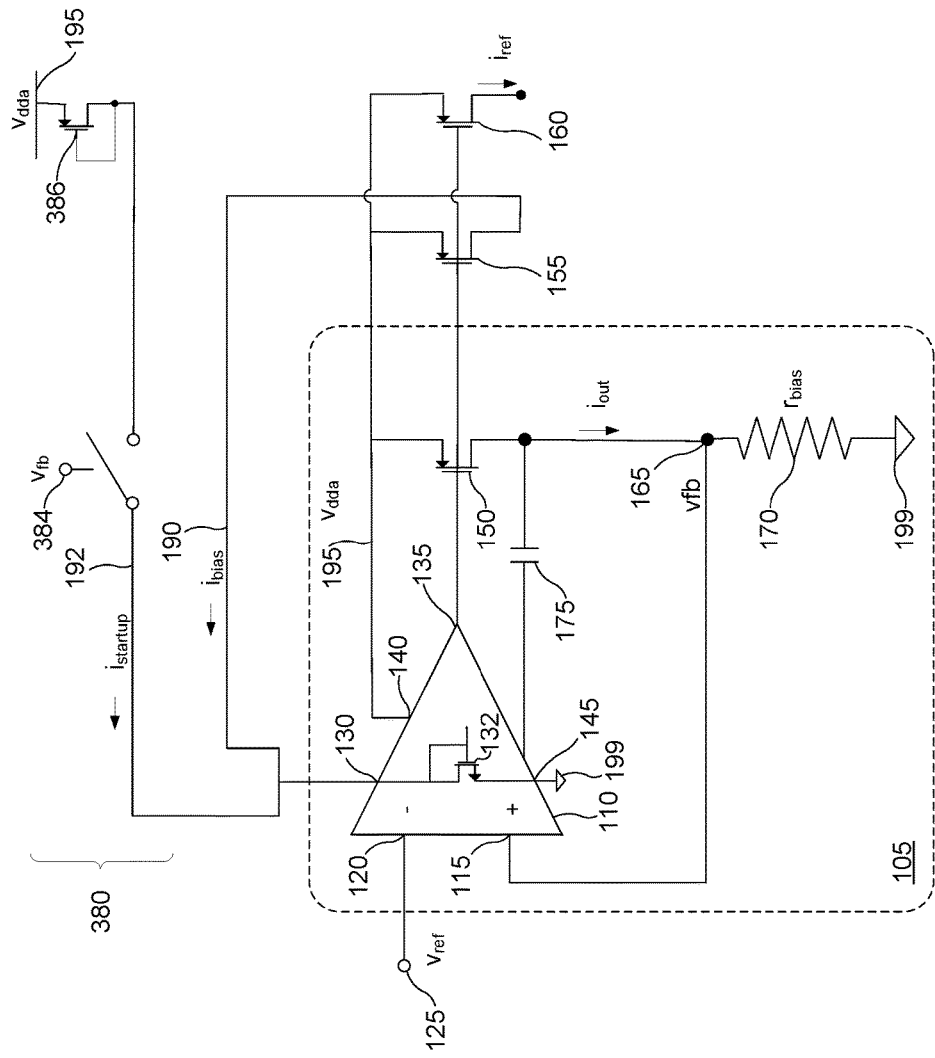
FIG. 3 illustrates a block diagram of a third example circuit or device.

To further aid in understanding the present disclosure, an example device 300 of the present disclosure is depicted in FIG. 3. In particular, device 300 may comprise a circuit, or a portion of an integrated circuit that is designed to provide a bias current that is proportional to a reference voltage at a reference voltage input port of an OTA. In other words, device 300 may comprise part of a larger circuit in a system-on-chip (SOC) design. At least a portion of device 300 contains the same or similar components as the example devices 100 of FIG. 1 and 200 of FIG. 2. For instance, voltage-to-current converter circuit 105 (and all components therein), second PMOS 155, feedback path 190, and third PMOS 160 may be the same or substantially similar components as those which are illustrated in FIGS. 1 and 2 and described above. In addition, such components may have the same or substantially similar operations as described above in connection with the examples of FIGS. 1 and 2.

Device 300 further includes a startup current generator circuit 380. In the example of FIG. 3, startup current generator circuit 380 comprises a switch 384 in series with a transistor diode 386 coupled to positive power supply 195 having voltage $V_{dda}$. The transistor diode 386 may comprise a PMOS that is drain-to-gate shorted. The switch 384 may be configured with a threshold voltage and may be controlled by $v_{fb}$ from feedback net 165. The startup current generator circuit 380 may provide startup current $i_{startup}$ to bias current input port 130 of OTA 110 via path 192 when the switch 384 is closed (e.g., when $v_{fb}$ is below the threshold voltage of the switch 184). As such, the transconductance of OTA 110 ($g_{m\text{-}ota}$) may initially be based upon the startup current $i_{startup}$ at a startup of device 300. As $v_{fb}$ ramps up toward $v_{ref}$, the transconductance of OTA 110 ($g_{m\text{-}ota}$) may be based upon the startup current $i_{startup}$ plus the bias current $i_{bias}$. When $v_{fb}$ reaches the threshold voltage, switch 384 may turn off (open) and cut off the startup current $i_{startup}$ to bias current input port 130 of OTA 110 via path 192. At this time, the OTA 110 may be solely self-biased with bias current $i_{bias}$ from feedback path 190. In one example, the threshold voltage may be set to switch out the startup current generator circuit 380 when the bias current $i_{bias}$ reaches an operational level for which the device 300 is designed. In another example, the threshold voltage may be set to switch out the startup current generator circuit 380 when the bias current $i_{bias}$ is not at a full operational level for which the device 300 is designed, but for a level when the bias current $i_{bias}$ is sufficient so that a metastable state of the device 300 is prevented.

Notably, the transistor diode 386 is self-limiting and may be designed to maintain the startup current $i_{startup}$ below a safe operating level. For instance, the transistor diode 386 may be sufficiently small to limit the current $i_{startup}$ to a maximum level when the transistor diode 386 is operating in the saturation region. In one example, the size of transistor diode 386 may provide for $i_{startup}$ to be less than or equal to the desired value of $i_{bias}$ during full normal operation of device 300 (e.g., after a startup phase, at which point OTA 110 is fully self-biased), e.g., half a target value of $i_{bias}$, 75 percent of a target value for $i_{bias}$, etc.

Figure 4:
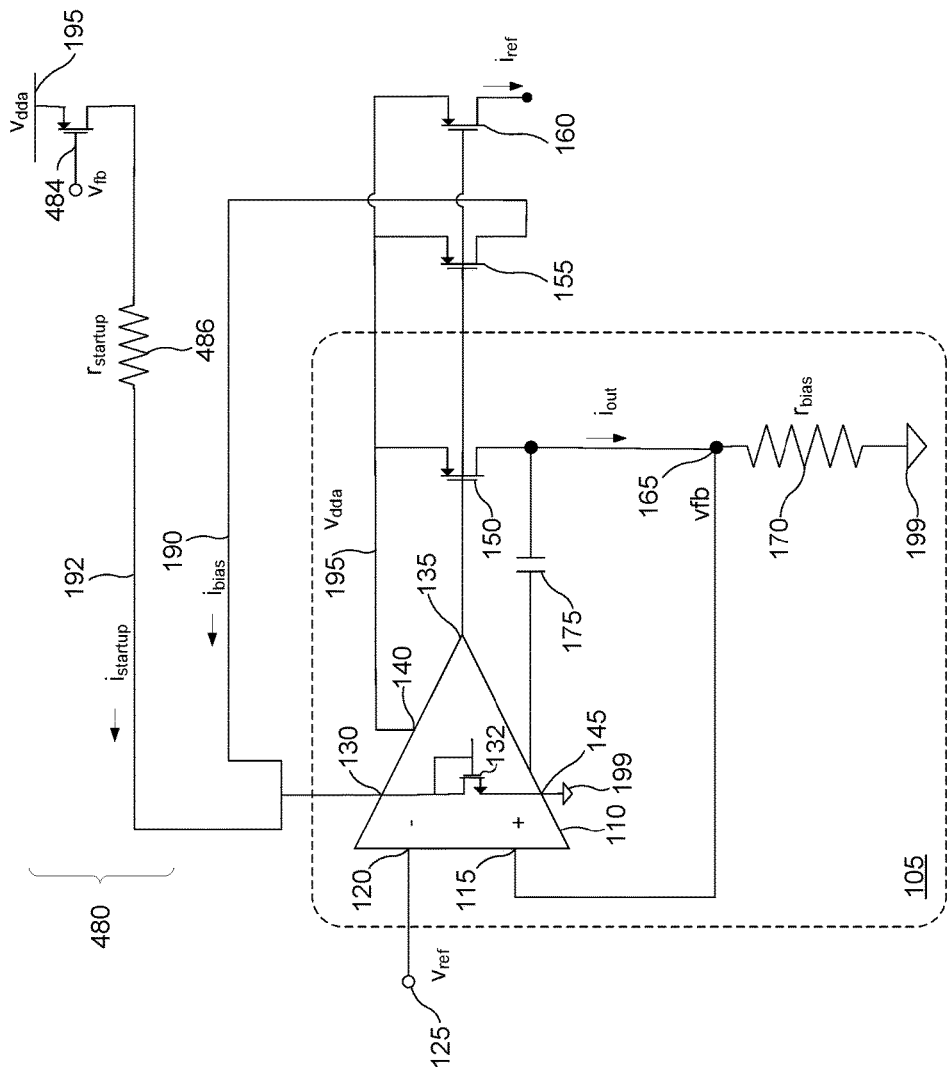
FIG. 4 illustrates a block diagram of a fourth example circuit or device.

To further aid in understanding the present disclosure, an example device 400 of the present disclosure is depicted in FIG. 4. In particular, device 400 may comprise a circuit, or a portion of an integrated circuit that is designed to provide a bias current that is proportional to a reference voltage at a reference voltage input port of an OTA. In other words, device 400 may comprise part of a larger circuit in a system-on-chip (SOC) design. At least a portion of device 400 contains the same or similar components as the example devices 100 of FIG. 1, 200 of FIG. 2, and/or 300 of FIG. 3. For instance, voltage-to-current converter circuit 105 (and all components thereof), second PMOS 155, feedback path 190, and third PMOS 160 may be the same or substantially similar components as those which are illustrated in FIGS. 1-3 and described above. In addition, such components may have the same or substantially similar operations as described above in connection with the examples of FIGS. 1-3.

Device 400 further includes a startup current generator circuit 480. In the example of FIG. 4, startup current generator circuit 480 comprises a resistor 486 in series with a PMOS 484. In one example, a source of PMOS 484 may be coupled to positive power supply 195 having voltage $V_{dda}$ and a drain of PMOS 484 may be coupled to the resistor 486. A gate of PMOS 484 may be controlled by $v_{fb}$ from feedback net 165. The startup current generator circuit 480 may provide startup current $i_{startup}$ to bias current input port 130 of OTA 110 via path 192 when the PMOS 484 is on/closed (e.g., with the source-to-gate voltage $V_{sg}$ is above a cutoff voltage of the PMOS 484). As such, the transconductance of OTA 110 ($g_{m\text{-}ota}$) may initially be based upon the startup current $i_{startup}$ at a startup of device 100. As $v_{fb}$ ramps up towards $v_{ref}$, the transconductance of OTA 110 ($g_{m\text{-}ota}$) may be based upon the startup current $i_{startup}$ plus the bias current $i_{bias}$. When $v_{fb}$ increases such that $V_{sg}$ is below the cutoff voltage of PMOS 484, PMOS 484 may turn off (open) and cut off the startup current $i_{startup}$ to bias current input port 130 of OTA 110 via path 192. At this time, the OTA 110 may be solely self-biased with bias current $i_{bias}$ from feedback path 190. In one example, the threshold voltage of $v_{fb}$ and/or the cutoff voltage of PMOS 484 may be set to switch out the startup current generator circuit 480 when the bias current $i_{bias}$ reaches an operational level for which the device 400 is designed. In another example, the threshold voltage of $v_{fb}$ and/or the cutoff voltage of PMOS 484 may be set to switch out the startup current generator circuit 480 when the bias current $i_{bias}$ is not at a full operational level for which the device 400 is designed, but for a level when the bias current $i_{bias}$ is sufficient so that a metastable state of the device 400 is prevented.

It should also be noted that resistance $r_{startup}$ of resistor 486 may be selected to limit the startup current $i_{startup}$ to a safe operating level, e.g., when $v_{fb}$ is zero and $V_{sg}$ of PMOS 484 is at a maximum. In one example, $r_{startup}$ of resistor 486 may provide for $i_{startup}$ to be less than or equal to the desired value of $i_{bias}$ during full normal operation of device 400 (e.g., after a startup phase, at which point OTA 110 is fully self-biased), e.g., half a target value of $i_{bias}$ 75 percent of a target value for $i_{bias}$, etc. In one example, $r_{startup}$ of resistor 486 and parameters of PMOS 484, e.g., size, saturation current, threshold voltage, etc.), may be selected to provide for when $v_{fb}$ is zero startup (e.g., at initial startup) to be equal to the desired value of $i_{bias}$ during full normal operation of device 400. In such an example, may ramp down as $i_{bias}$ ramps up startup until startup is cutoff when $v_{fb}$ reaches a threshold (e.g., when $V_{sg}$ of PMOS 484 reaches the cutoff voltage of PMOS 484).

Figure 5:
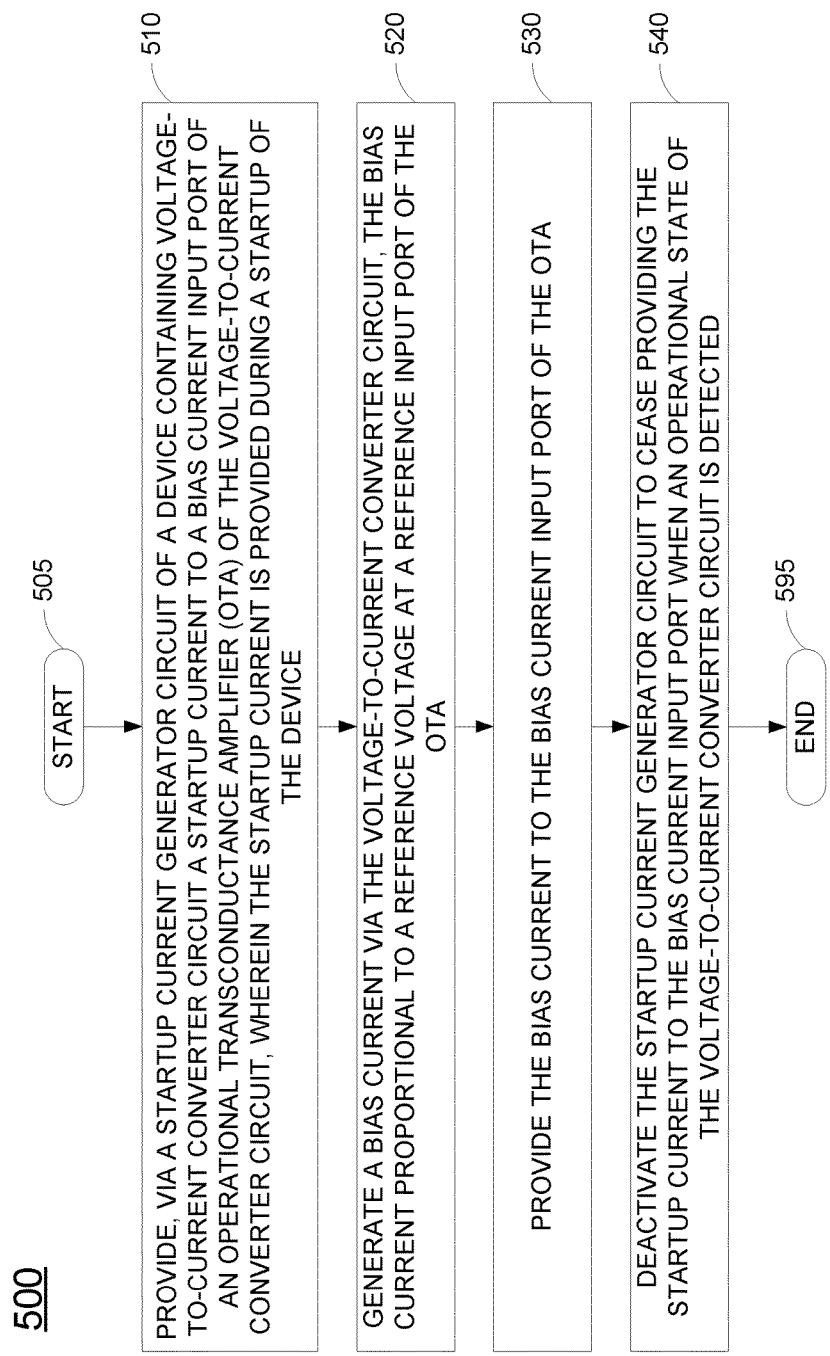
FIG. 5 illustrates a flow diagram of an example method for providing a startup current.

To further aid in understanding the present disclosure, FIG. 5 illustrates a flow diagram of an example method 500 for providing a startup current. For example, any one or more of the steps, operations or functions of the method 500 may be implemented by a device or circuit, or any one or more components thereof, as described above in connection with FIGS. 1-4. For illustrative purposes, the method 500 is described below as being performed by one of these example devices. The method 500 starts in step 505 and proceeds to step 510.

In step 510, the device (e.g., comprising a voltage-to-current converter circuit) provides a startup current to a bias current input port of an operational transconductance amplifier (OTA) of the voltage-to-current converter circuit. In one example, the startup current is provided via a startup current generator circuit of the device. In one example, the startup current is provided at step 510 during a startup of the device. In various examples, the startup current generator circuit comprises a load switch, a switch in series with a resistor, a switch in series with a transistor diode, or a PMOS in series with a resistor. In one example, the startup current generator circuit is coupled to a bias current input port of the OTA. In addition, in one example, the startup current generator circuit is controllable to provide a startup current to the bias current input port during a startup of the device and to be deactivated after the startup of the device (e.g., via a switch or using a PMOS cutoff voltage).

At step 520, the device generates a bias current via the voltage-to-current converter circuit, where the bias current is proportional to a reference voltage at a reference voltage input port of the OTA. For instance, aspects of an example voltage-to-current converter circuit are described above which establish the relationship of Equation 5 relating the output current $i_{out}$ to the input reference voltage $v_{ref}$. In addition, as further described above, a current mirror comprising a first PMOS and a second PMOS may provide a bias current $i_{bias}$ that is proportional the output current $i_{out}$. In one example, the bias current is proportional to a current through the first PMOS (e.g., based upon a size ratio of the first PMOS to the second PMOS of the current mirror).

At step 530, the device provides the bias current to the bias current input port of the OTA. For instance, as illustrated above in any of the examples of FIGS. 1-4, the bias current $i_{bias}$ may be fed back to a bias current input port 130 of the OTA 110, e.g., to control the transconductance of the OTA ($g_{m-ota}$). In one example, the bias current is provided via a drain of a second PMOS of the current mirror.

At step 540, the device deactivates the startup current generator circuit to cease providing the startup current to the bias current input port when an operational state of the voltage-to-current converter circuit is detected. For instance, the operational state may be a particular state in which a voltage is detected above a threshold, e.g., when $v_{fb}$ at a feedback net of the voltage-to-current converter circuit exceeds a threshold. In one example, the startup current generator circuit may be deactivated or switched off using a switch of the startup current generator circuit. In one example, the startup current generator circuit may be deactivated when a voltage, e.g., $v_{fb}$ driving a PMOS gate, causes the source-to-gate voltage of the PMOS to drop below a cutoff voltage of the PMOS. In other words, the startup current generator circuit is controlled by a voltage of the feedback net to provide a current to the bias current input port of the OTA when a voltage of the feedback net is below a threshold voltage, and to provide no current to the bias current input port of the OTA when the voltage of the feedback net is above the threshold voltage.

Following step 540, the method 500 proceeds to step 595 where the method 500 ends.

It should be noted that in various examples of the present disclosure, the method 500 may include other, further and different steps than those described above. For example, the method 500 may include steps or operations in accordance with the functions of any one or more of the components or circuits of the example devices described herein. For instance, method 500 may include steps directed to any one or more additional functions of a startup current generator circuit, a voltage-to-current converter circuit, an OTA, a feedback path, a current mirror, and so forth.

In addition, although not specifically specified, one or more steps, functions or operations of the method 500 may include a storing, displaying and/or outputting step as required for a particular application. In other words, any data, records, fields, and/or intermediate results discussed in the respective methods can be stored, displayed and/or outputted to another device as required for a particular application. Furthermore, steps or blocks in FIG. 5 that recite a determining operation or involve a decision do not necessarily require that both branches of the determining operation be practiced. In other words, one of the branches of the determining operation can be deemed as an optional step.

While the foregoing describes various examples in accordance with one or more aspects of the present disclosure, other and further embodiment(s) in accordance with the one or more aspects of the present disclosure may be devised without departing from the scope thereof, which is determined by the claim(s) that follow and equivalents thereof. Claim(s) listing steps do not imply any order of the steps. Trademarks are the property of their respective owners.

What is claimed is:

1. A device, comprising:
    a voltage-to-current converter circuit, the voltage-to-current converter circuit comprising an operational transconductance amplifier (OTA), the voltage-to-current converter circuit for generating a bias current that is proportional to a reference voltage at a reference voltage input port of the OTA;
    a bias current feedback path for providing the bias current to a bias current input port of the OTA; and
    a startup current generator circuit, the startup current generator circuit coupled to the bias current input port of the OTA, wherein the startup current generator circuit is controllable to provide a startup current to the bias current input port during a startup of the device and is controllable to be deactivated after the startup of the device.

2. The device of claim 1, wherein the startup current generator circuit comprises a switch in series with a resistor.

3. The device of claim 1, wherein the startup current generator circuit comprises a load switch.

4. The device of claim 1, wherein the startup current generator circuit comprises a switch in series with a transistor diode.

5. The device of claim 1, wherein the startup current generator circuit comprises a p-channel metal-oxide-semiconductor field effect transistor (PMOS) in series with a resistor.

6. The device of claim 1, wherein the startup current generator circuit is coupled to a positive power supply of the device.

7. The device of claim 1, wherein the voltage-to-current converter circuit further comprises:
a first p-channel metal-oxide-semiconductor field effect transistor (PMOS); and
a resistor.

8. The device of claim 7, wherein the OTA comprises:
a reference voltage input port;
a feedback voltage input port; and
an output voltage port;
wherein a gate of the first PMOS is coupled to the output voltage port of the OTA, wherein a source of the first PMOS is coupled to a positive power supply of the device, wherein a first end of the resistor is coupled to a ground of the device, wherein a second end of the resistor is coupled to a drain of the first PMOS and to the feedback voltage input port of the OTA in a feedback net.

9. The device of claim 8, wherein the startup current generator circuit is controlled by a voltage of the feedback net.

10. The device of claim 8, wherein the bias current feedback path comprises:
a second PMOS, wherein a gate of the second PMOS is coupled to the output voltage port of the OTA, wherein a source of the second PMOS is coupled to the positive power supply of the device, wherein a drain of the second PMOS is coupled to the bias current input port of the OTA.

11. The device of claim 10, wherein the first PMOS and the second PMOS form a current mirror.

12. The device of claim 10, wherein the bias current is provided via a drain of the second PMOS.

13. The device of claim 12, wherein the bias current is proportional to a current through the first PMOS.

14. The device of claim 13, wherein a voltage of the feedback net is based upon the current through the first PMOS and a resistance of the resistor.

15. A device, comprising:
an operational transconductance amplifier (OTA), comprising:
a reference voltage input port;
a feedback voltage input port;
a bias current input port; and
an output voltage port;
a first p-channel metal-oxide-semiconductor field effect transistor (PMOS), wherein a gate of the first PMOS is coupled to the output voltage port of the OTA, wherein a source of the first PMOS is coupled to a positive power supply; and
a resistor, wherein a first end of the resistor is coupled to a ground, wherein a second end of the resistor is coupled to a drain of the first PMOS and to the feedback voltage input port of the OTA in a feedback net;
a second PMOS, wherein a gate of the second PMOS is coupled to the output voltage port of the OTA, wherein a source of the second PMOS is coupled to the positive power supply, wherein a drain of the second PMOS is coupled to the bias current input port of the OTA; and
a startup current generator circuit, the startup current generator circuit coupled to the bias current input port of the OTA, the startup current generator circuit to provide a current to the bias current input port when a voltage at the feedback net is below a threshold voltage, and to provide no current to the bias current input port when the voltage at the voltage at the feedback net is above the threshold voltage.

16. The device of claim 15, wherein the startup current generator circuit comprises a switch in series with a resistor.

17. The device of claim 15, wherein the startup current generator circuit comprises a load switch.

18. The device of claim 15, wherein the startup current generator circuit comprises a switch in series with a transistor diode.

19. The device of claim 15, wherein the startup current generator circuit comprises a p-channel metal-oxide-semiconductor field effect transistor (PMOS) in series with a resistor.

20. A method, comprising:
providing, via a startup current generator circuit of a device containing a voltage-to-current converter circuit, a startup current to a bias current input port of an operational transconductance amplifier (OTA) of the voltage-to-current converter circuit, wherein the startup current is provided during a startup of the device;
generating a bias current via the voltage-to-current converter circuit, the bias current proportional to a reference voltage at a reference voltage input port of the OTA;
providing the bias current to the bias current input port of the OTA; and
deactivating the startup current generator circuit to cease providing the startup current to the bias current input port when an operational state of the voltage-to-current converter circuit is detected.

* * * * *